United States Patent [19]

Eatock

[11] Patent Number: 4,504,797

[45] Date of Patent: Mar. 12, 1985

[54] PREAMPLIFIER CIRCUITS

[75] Inventor: Fred L. Eatock, Cupertino, Calif.

[73] Assignee: Hewlett-Packard Company, Palo Alto, Calif.

[21] Appl. No.: 433,582

[22] Filed: Oct. 12, 1982

[51] Int. Cl.³ .............................................. H03F 1/34
[52] U.S. Cl. .................................... 330/293; 330/100
[58] Field of Search ............... 330/100, 278, 285, 293, 330/311

[56] References Cited

U.S. PATENT DOCUMENTS 4,415,868 11/1983 Gross .................................. 330/107

Primary Examiner—James B. Mullins
Assistant Examiner—G. Wan
Attorney, Agent, or Firm—Edward Y. Wong

[57] ABSTRACT

By providing a current splitter stage and a feedback loop to current and voltage gain stages of an amplifier, a preamplifier can be implemented as an integrated circuit. This integrated preamplifier is particularly suited in bar code reader systems and fiber optic receiver systems.

11 Claims, 6 Drawing Figures

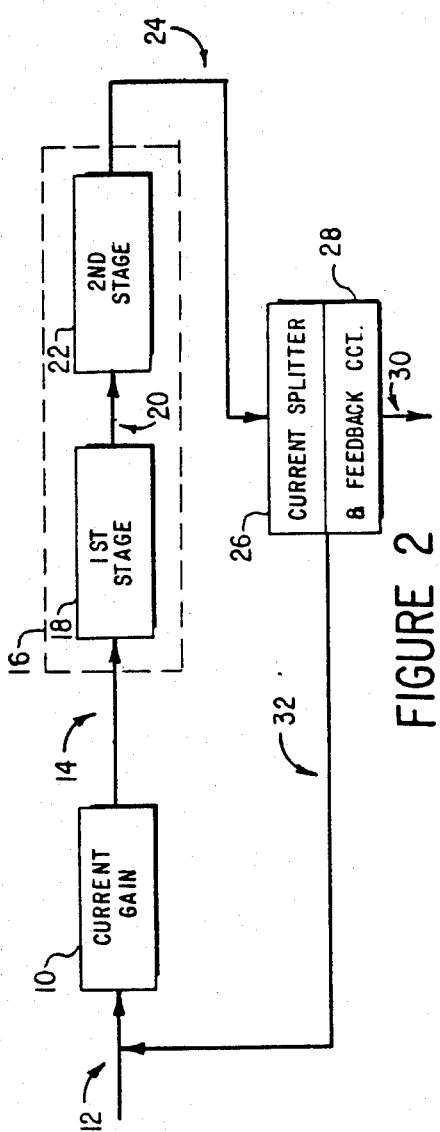
FIGURE 2
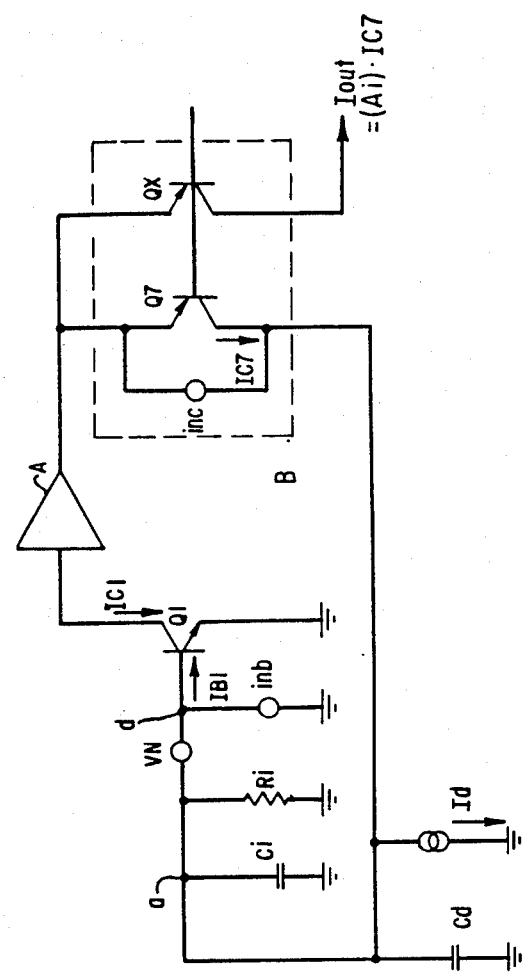
FIGURE 4
FIGURE 1 (PRIOR ART)
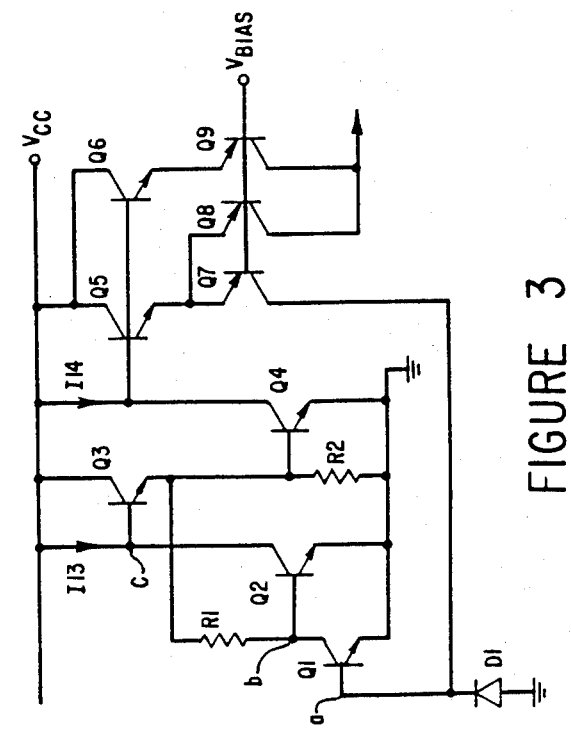
FIGURE 3

4,504,797

PREAMPLIFIER CIRCUITS

BACKGROUND OF THE INVENTION

This invention is concerned with improvements in or relating to preamplifier circuits and is especially concerned with integrated preamplifier circuits.

The circuit of a typical prior art photodetector preamplifier is shown in FIG. 1 and comprises an FET operational amplifier having a large feedback resistor connected between the output of the amplifier and the negative input, the positive input being grounded. If the amplifier has a low input current as, for example, when it is connected to a small diameter photodiode in a light ambient, the preamplifier noise level is dominated by the noise of the large feedback resistor; and for a noise level which is comparable to the bias current effects of the amplifier, the resistor would have to be of the order of 250 megohms, for a FET input operational amplifier. Even a resistor having a resistance value of 2 megohms would be quite inpractical for integrated circuit implementation and, besides, would exhibit poor noise and bandwidth performance; thus, the implementation of the less-than-optimal circuit of FIG. 1 in integrated circuit format would be impractical.

SUMMARY OF THE PRESENT INVENTION

The present invention provides a high gain preamplifier circuit which is especially suited to fabrication as an integrated circuit, in which form it can be utilized in, for example, bar code reader devices or in fiber optic receiver devices. The circuit comprises a current gain stage which is connected to a two-stage voltage gain circuit which provides a non-phase-inverted output; this output is connected to a current splitter circuit which provides a feedback loop to the preamplifier input and provides an output which may be connected, for example, to a post amplifier. For integrated circuit implementation, and in one preferred embodiment of the present invention at least, the circuit splitter circuit should be constructed as an integrated circuit upon a single chip, the current splitter circuit comprising a pair of commonly-connected-collector and a pair of commonly-connected-base transistors, having their emitters connected to further complementary transistors all of whose geometries are chosen in the fabrication of the integrated circuit such that the required current gain is achieved with bandwidth, linearity, and noise performance comparable to the best commercial discrete form of operational amplifier and feedback resistor combinations available at this time.

With the entire preamplifier circuit according to the invention in another preferred embodiment as a monolithic integrated circuit, the cost is substantially lower than when discrete conventional components are used. Further, as a monolithic integrated circuit, the circuit has fewer package interconnects and consequently displays higher reliability. Additionally, the integrated circuit can be completely shielded inside a conventional metal can package, thereby protecting the circuit against ambient electromagnetic interference.

To provide a preamplifier having a current splitter circuit configured in accordance with the present invention, but with the components provided in discrete form, would be impractical due to the problems of component matching between the various transistors of the configuration. Furthermore, it is considered that the use of field-effect transistors (FET's), which require large voltages, would be impractical due to the need to operate the preamplifier with very low voltage supplies.

BRIEF DESCRIPTION OF THE DRAWINGS

FIG. 1 is a circuit diagram of a conventional preamplifier circuit.

FIG. 2 is a block schematic circuit diagram of a preamplifier according to a preferred embodiment of the present invention.

FIG. 3 is a detailed circuit diagram of the preamplifier of FIG. 2.

FIG. 4 is a simplified circuit diagram of the preamplifier of FIG. 3 showing sources of noise contributed by the preamplifier.

DESCRIPTION OF THE PREFERRED EMBODIMENT

Figure 5:
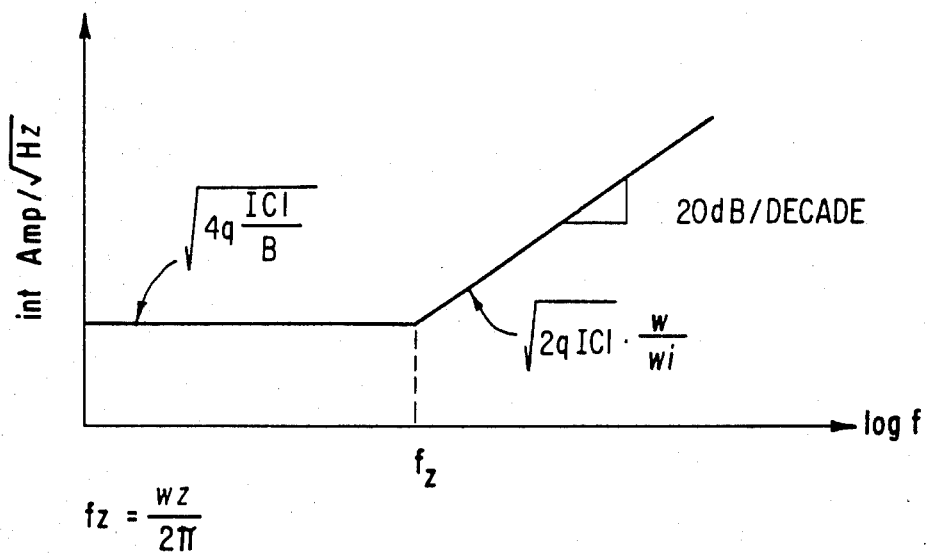
FIG. 5 is a graph of spectral noise density versus frequency for the circuit of FIG. 4.

FIG. 2 shows a general schematic block diagram of a preamplifier circuit according to the present invention. The circuit comprises a current gain circuit 10 having an input port 12, which is the input port of the preamplifier circuit, and an output port 14 connected to the input port of a two-stage voltage gain circuit 16 comprising a first stage 18 having an output port 20 connected to an input port of a second stage 22. The first stage 18 of the voltage gain circuit 16 provides, in effect, a short circuit load impedance (see FIGS. 3 and 6) to a current at the input port of the voltage gain circuit 16, and the second voltage gain circuit 22 produces a non-inverted output. The output port 24 of the second stage 22 is connected to the input port of current splitter circuit 26, which includes a feedback circuit 28. The current splitter circuit 26 has an output port 30, which is the output port of the preamplifier circuit, and the feedback circuit 28 has an output port 32, which is connected to the input port 12, for the purpose of applying current feedback around the complete preamplifier.

In FIG. 3 there is shown a detailed circuit diagram of a preamplifier according to a preferred embodiment of the present invention. This circuit may be employed, for example, in bar code reader or fiber optic applications.

The illustrated preamplifier comprises a current gain circuit provided by a grounded-emitter, npn transistor Q1, which has its base connected to a grounded photodiode D1 of, for example, the aforementioned bar code reader. The base of the transistor Q1 is connected also to a feedback loop, as hereinafter described. The collector of the transistor Q1 is the output port of the current gain circuit and is connected to the input port of a voltage gain circuit of the preamplifier.

The voltage gain circuit comprises first and second stages, the first stage being provided by second and third npn transistors Q2 and Q3 arranged as a transresistance amplifier with a resistor R1 providing the feedback resistance between the emitter of the transistor Q3 and the base of the transistor Q2 to provide an effective short circuit load impedance to current at the input of the voltage gain circuit. The base of the transistor Q2 is connected to the collector or output port of the transistor Q1. The transistor Q2 has a grounded emitter and has its collector connected to a current source I13 and to the base of the transistor Q3. The collector of the transistor Q3 is connected to the voltage source Vcc, and its emitter provides the output of the first voltage gain stage. The second voltage gain stage is provided by a fourth, grounded emitter, npn transistor Q4, the base of which is connected via a resistor R2 and to the emitter of the transistor Q3. The collector of the transistor Q4 is connected to the current source I14 and to an input port of the current splitting circuit of the illustrated preamplifier.

The current splitting circuit comprises a pair of fifth and sixth, npn transistors Q5 and Q6, respectively, a pair of seventh and eighth, pnp transistors Q7 and Q8, and a ninth, pnp transistor Q9. The input of the current splitting circuit is provided by the commonly connected bases of the transistors Q5 and Q6, whose collectors are commonly connected to the voltage source Vcc. The emitter of the transistor Q5 is connected to the emitters of the two transistors Q7 and Q8, and the emitter of the transistor Q6 is connected to that of Q9, the bases of the transistors Q7, Q8, and Q9 being connected to a bias voltage source Vbias. The collectors of the transistors Q8 and Q9 are connected together and provide the preamplifier output, while the collector of the transistor Q7 is connected to the base of the transistor Q1, thereby providing a feedback loop for the current gain preamplifier.

Typically, in an application of the preamplifier for use in a bar code scanner, a photodiode represented by D1 provides the light-sensitive interface of the scanner and will generate a current, when in use, of between 1 nA to 300 nA, which is sufficient to modulate the base and collector currents of the transistor Q1. By comparison, the current generated in a typical fiber optic application would be in the range of 10 nA to 5 μA. In relation to the present invention, it is foreseen that the photodiode input current may be as low as 100 pA and still be capable of producing a detectable output signal representative of the bars and spaces of a bar code.

Current supply to the transistor Q1 is from the feedback loop from the transistor Q7, and the gain of the current gain stage is determined by the beta (B) of the transistor Q1 to provide an output signal to the input port of the voltage gain circuit Q2, Q3, and Q4. At the transistor Q2 the input signal is amplified and phase-inverted. Typically there is a small voltage drop across the feedback rsistor R1 to establish the collector current of the transistor Q1, while the transistor Q3 provides impedance buffering of the output signal from the transistor Q2. As stated above the feedback resistor R1, besides determining the collector current of Q1, also determines the transresistance of the first voltage gain stage. The use of a transresistance amplifier Q2, Q3, R1 as a load for the current gain stage Q1 serves as a means of improving the frequency response and transient stability of the preamplifier. This is seen by noting that without the transresistance amplifier the major frequency response limiting time constants will occur at nodes a and b. In as much as these time constants have similar values and are dependent on the collector current of Q1, there is little means of adjusting the preamplifier phase margin for optimal stability. This problem is overcome with the transresistance amplifier, which forces the bandwidth limiting time constants to occur at nodes a and c, where the time constants can be independently controlled through selection of the collector currents of both Q1 and Q2. The resulting separation in value of these two time constants then permits improvements in bandwidth and transient stability. The signal from the transistor Q3 is then presented as a voltage signal at the base of the transistor Q4, which provides an inverting gain stage and, in the subsequent overall feedback loop, ensures that the feedback signal is of correct phase for proper operation when the overall feedback loop is closed.

The voltage output of the transistor Q4 with respect to the bias voltage Vbias on the base of the transistor Q7 is set so that the transistors Q5 through Q9 convert this voltage into currents at the feedback and output ports. In the integrated circuit, the emitter of the transistor Q6 is, as is also known in the art, of greater area than that of the transistor Q5, while the area of the emitter of the transistor Q9 is greater than that of the transistors Q7 and Q8 for the output current to be greater than the current in the feedback loop.

The emitter area ratios of the transistors Q5 and Q6 and of the transistors Q7, Q8, and Q9 together with the collector peripheries of the transistors Q7 and Q8 determine, as is known in the art, the current ratioing characteristics of the current splitter circuit. Typically, the emitter ratio of Q6/Q5 will be approximately 11:1, and that of Q9/Q7+Q8 will also be approximately 11:1. With the collector peripheries of Q8/Q7 at approximately 7:1, the resulting current split ratio of the output current to the feedback current will be 100:1.

It is believed that the above-described circuit is most advantageously configured as a single integrated circuit chip. However, it is also foreseen that an equivalent circuit could also be implemented by forming only the transistors Q5, Q6, Q7, Q8, and Q9 with the remaining components provided in discrete form and properly connected thereto.

Further, in place of the transistor Q1, a super beta transistor can be substituted and the operating bias currents adjusted to reduce the noise which is dependent upon the shot current of the transistor Q1, and also to increase the bandwidth limits.

In FIG. 4, there is shown a simplified schematic circuit diagram illustrating the functional elements of the preamplifier circuit of FIG. 3 for the purpose of explaining the noise analysis of the preamplifier circuit. Therein, the voltage gain circuit provided by the transistors Q2, Q3, and Q4 is indicated by the amplifier A, and the current splitter circuit provided by the transistors Q5, Q6, Q7, Q8, and Q9 is represented by the block B including the transistor Q7 and the transistor QX which represents the network of the transistors Q5, Q6, Q8, and Q9. In the circuit diagram, the equivalent noise sources of the transistors Q1 and Q7 are shown separately at vn, inb and inc for the purpose of analysis, so that the transistors Q1, Q7, and the amplifier A can be considered as a noiseless circuit. The photodiode D1 is represented by an equivalent circuit comprising a capacitor Cd and a current source Id while Ri represents an ideal noiseless resistor resulting from the input resistance of the transistor Q1. The input capacitance of the transistor Q1 is represented by the capacitor Ci, which also includes any applicable parasitic capacitances. For purposes of discussion, the two capacitances can be combined to provide an equivalent capacitance Ct such that $Ct = Cd + Ci$.

The resistance Ri can be calculated from the equation:

$$Ri = (BkT/qIC1) \tag{1}$$

where B is transistor current gain IC1/IB1, IC1 is the DC collector current of transistor Q1, IB1 is the DC base current, and k = Boltzmann's constant,
q = electron charge, and
T = absolute temperature in degrees Kelvin.

Due to the feedback nature of this circuit, the transistor Q7 provides all currents flowing away from the node a and so $$IC7 = IB1 + Id + inb - inc + wCtvn + Vn/Ri, \quad (2)$$

with $Iout = (Ai)(IC7)$, and where:

IC7 = combined DC and instantaneous collector current of the transistor Q7,
Id = signal current flowing in the photodiode,
inb = instantaneous noise current due to the base current shot noise of the transistor Q1,
inc = instantaneous noise current due to collector current shot noise of the transistor Q7,
vn = instantaneous noise voltage resulting from the shot noise of the collector current of the transistor Q1,
w = radian frequency,
Ai = current split ratio of the current splitter geometries, and
Iout = output current of the circuit.

Because noise performance is only important for low signal levels, the following calculations will assume that the signal current, Id, is approximately zero.

Considering now only the instantaneous current and voltage components of equation (2) by expressing them in rms quantities, it can be shown that the total input referred noise current per cycle of bandwidth, for uncorrelated sources, can be calculated as follows, the node d functions as a virtual ground in the analysis:

$$(int)^2 = (inb)^2 + (inc)^2 + (vn/Ri)^2 + (wCtvn)^2. \quad (3)$$

Employing the usual shot noise formulas for currents, $$(inb)^2 = 2qIb1 = 2qIC1/B;$$

$$(inc)^2 = 2qIC7. \quad (4)$$

As Id approaches zero, $IC7 = IB1$, and $$(inc)^2 = 2qIC7 = 2qIB1 = 2qIC1/B. \quad (5)$$

It can also be shown that the equivalent noise voltage source vn can be expressed as $$vn = kT(2/qIC1)^{\frac{1}{2}}. \quad (6)$$

Substituting equations (1), (4), (5), and (6) into equation (3) gives the following result:

$$(int)^2 = 2qIC1/B + 2qIC1/B + (kT)^2(2/qIC1)/(BkT/qIC1)^2 + (wCtkT)^2(2/qIC1) = 4qIC1/B + 2qIC1/B^2 + 2kT(wCt)^2(kT/qIC1).$$

For npn transistors, B is equal or greater than 40, and so the second term of the above equation, i.e., $2qIC1/B^2$, is much smaller than the first term and can be ignored, thus reducing the equation to $$(int)^2 = 4qIC1/B + 2kT(wCt)^2(kT/qIC1). \quad (7)$$

Thus, for low radian frequencies approaching DC conditions, w approaches zero, and $$(int) = 2(qIC1/B)^{\frac{1}{2}}, \quad (8)$$

while at high frequencies, the first term can be ignored, and $$(int)' = kTwCt(2/qIC1)^{\frac{1}{2}}. \quad (9)$$

From these last two equations (8) and (9), it can be observed that (a) at low frequencies, noise deceases as B increases and as the DC collector current decreases in the transistor Q1, and (b) at high frequencies the noise level is frequency dependent (increases with frequency), is also capacitance dependent (increases with capacitance) and decreases with increasing collector current IC1 in the transistor Q1.

Equation (7) can be rewritten in the form:

$$(int)^2 = 4qIC1/B + 2qIC1(wCt)^2(kT/qIC1)^2, \quad (10)$$

where kT/qIC1 has the units of resistance.

If the time constant Ct(kT/qIC1) is expressed as 1/w1, then equation (10) can be written in the form, $$(int)^2 = 4qIC1/B + 2qIC1(w/w1)^2. \quad (11)$$

Now, if the frequency at which the spectral noise density curve versus frequency begins to increase is defined as w2, then w2 can be found by noting that this is the frequency at which both terms of equation (11) are equal. Thus, $$4qIC1/B = 2qIC1(w2/w1)^2, \text{ or}$$

$$w2 = w1(2/B)^{\frac{1}{2}} = (1/Ct(kT/qIC1))(2/B)^{\frac{1}{2}}. \quad (12)$$

The relationships between equations (8), (9) and (12) are shown plotted in FIG. 5.

In relation to the possible use, referred to previously, of superbeta transistors, it is important to note that the total noise observed in a bandwidth larger than fz, where $fz = w2/2\pi$, is a function of both the flatband noise and the noise beyond the corner frequency fz. If the curve in FIG. 5 is designated by the spectral noise density versus frequency in amperes/Hertz 1/2, then for fe greater than fz, the rms noise in a bandwidth fe can be found using the function $$In = \left( \int_0^{fe} [SI(f)]^2 df \right)^{\frac{1}{2}}. \quad (13)$$

This equation can predict a minimization of In by firstly reducing the term $(4qIC/B)^{\frac{1}{2}}$ and further by pushing the corner frequency, fz, in FIG. 5 as far to the right as possible through appropriate design of the components, their performance parameters, and the operating bias of the transistors, specifically the transistor Q1.

Equations (8) and (12) suggest that the use of transistors with B as large as it is possible to achieve will permit both the noise predicted by equation (8) and the noise beyond the corner frequency fz, as predicted by equation (12), to be reduced simultaneously.

To illustrate with respect to a circuit according to the present invention, where $$q = 1.6 \times 10^{-19} \text{ ev},$$

$$IC1 = 1.75 \times 10^{-6} \text{ amp,}$$

$$B = 120, \text{ and}$$

$$Ct = 17.5 \times 10^{-12} \text{ F,}$$

then the predicted result is $$(4qIC1/B)^{\frac{1}{2}} = 0.966 \times 10^{-13} \text{ amp/Hz}^{\frac{1}{2}}, \text{ and}$$

$$fz = 79 \text{ kHz.}$$

In a second example, where $IC1' = 5IC1$ and $B' = 10B$, then the predicted result is $$(4qIC1'/B')^{\frac{1}{2}} = 0.683 \times 10^{-13} \text{ amp/Hz}^{\frac{1}{2}}, \text{ and}$$

$$fz = 125 \text{ kHz.}$$

Thus, it can be seen that both the flatband noise can be reduced and the noise corner frequency can be increased by first increasing the transistor B by a factor of 10 and then increasing the DC operating collector current of Q1 to compensate. This is exactly what would be accomplished by using superbeta integrated circuit processing in the design of a preamplifier according to the present invention.

Figure 6:
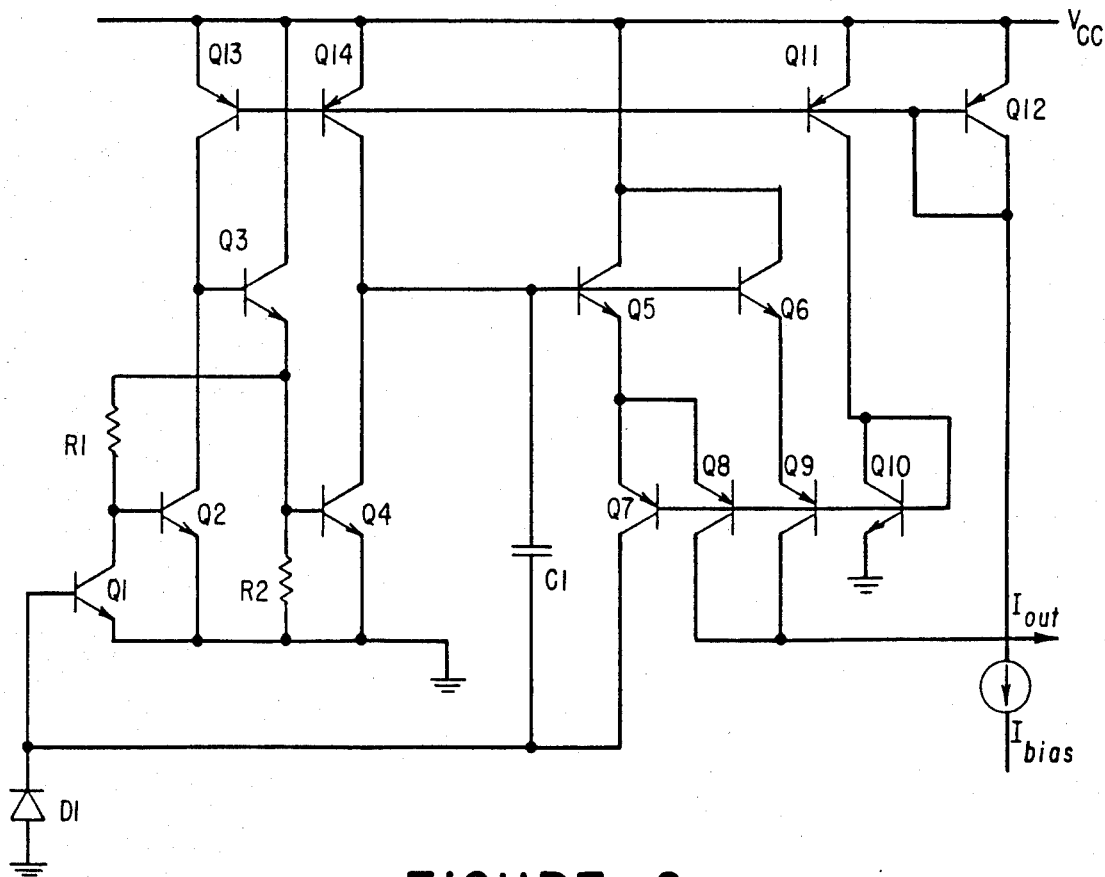
FIG. 6 is a detailed circuit diagram of a further preamplifier according to the present invention.

FIG. 6 shows a second preamplifier circuit according to the present invention. This circuit is substantially similar to that shown in FIG. 3 but includes a number of further elements, namely, a capacitor C1 and five transistors Q10-Q14, the purpose of which is hereinafter described.

The capacitor C1 is connected between the feedback loop from the collector of the transistor Q7 and to the base of the transistor Q5. It provides frequency compensation for the closed loop feedback amplifier by bypassing the bandwidth limited operation of transistors Q5 and Q7.

The transistor Q13 is a pnp transistor having its collector connected to the base of the transistor Q3, (and thus to the collector of the transistor Q2), its emitter connected to the voltage source Vcc and its base connected to the base of each of the transistors Q14, Q11, and Q12, all of which are pnp type and have their emitters connected to the voltage source Vcc. The collector of the transistor Q14 is connected to the base of the transistor Q5, (and thus to the collector of the transistor Q4). The collector of the transistor Q11 is connected to the base and to the collector of the transistor Q10, which is of npn type and has its emitter grounded and its base connected to the bases of the transistors Q7, Q8, and Q9. All of these component transistors serve to bias the preamplifier to the preferred operating currents.

The transistors Q13 and Q14 provide current sources for the transistors Q2 and Q4 while the transistor Q11 provides bias to supply operating current to the transistor Q10 to bias the transistors Q7, Q8, and Q9. Another transistor Q12 is provided to bias the transistors Q11, Q13, and Q14.

As can be readily seen in a comparison between FIGS. 3 and 6, the advantages to the present invention are similarly realized with this alternate preferred embodiment.

I claim:

1. A preamplifier circuit comprising:
    means for providing current gain, said current gain means having an input and an output port;
    means for providing voltage gain, said voltage gain means having an input and an output port, the input port being connected to the output port of the current gain means for providing a short circuit impedance to a current at the input port of the voltage gain means and for producing a non-inverted output; and
    means for splitting current, said current splitter means (a) having an input port connected to the output port of the voltage gain means for splitting current received therefrom to provide an output current of the preamplifier, (b) providing a feedback loop to the input port of the current gain means, and (c) forming a portion of an integrated circuit.

2. The preamplifier circuit, according to claim 1 wherein the current gain means, the voltage gain means, and the current splitter means form a portion of an integrated circuit.

3. The preamplifier circuit according to claim 2 wherein the voltage gain means comprises a first inverting gain stage having a transresistance amplifier and a second inverting gain stage coupled thereto.

4. The preamplifier circuit according to claim 3 wherein the current gain means comprises a transistor circuit having an input port, an output port and a common grounded terminal, the input port being connected to the feedback loop of the current splitter means.

5. The preamplifier circuit according to claim 4 wherein the second inverting gain stage comprises a second transistor circuit having an input port, an output port and a common ground.

6. The preamplifier circuit according to claim 5 wherein the current splitting means comprises:
    a third transistor circuit having a pair of output ports, one of which is connected to a fourth transistor circuit having a second pair of output ports and the other of which is connected to a fifth transistor circuit having an output port connected to one output port of the second pair of output ports, the other output port of said second pair of output ports providing the feedback loop to the input port of the current gain means.

7. The preamplifier circuit according to claim 6 wherein the third transistor circuit comprises a first pair of transistors having their bases commonly connected and their collectors commonly connected, the fourth transistor circuit comprises a second pair of complementary transistors having their emitters connected to the emitter of one transistor of the first pair of transistors and the fifth transistor circuit comprises a further complementary transistor the emitter of the other transistor of the first pair of transistors being connected to the emitters of the further complementary transistor, the collector of the further complementary transistor and of one of the transistors of the second pair being connected to provide the output of the preamplifier circuit and the collector of the other of the transistors of the second pair providing the other output for the feedback loop.

8. The preamplifier circuit according to claim 2 wherein the current gain means comprises a transistor circuit having an input port, an output port and a common grounded terminal, the input port being connected to the feedback loop of the current splitter means.

9. The preamplifier circuit according to claim 4 wherein the second inverting gain stage comprises a second transistor circuit having an input port, an output port and a common ground.

10. The preamplifier circuit according to claim 2 wherein the current splitting means comprises:
a third transistor circuit having a pair of output ports, one of which is connected to a fourth transistor circuit having a second pair of output ports and the other of which is connected to a fifth transistor circuit having an output port connected to one output port of the second pair of output ports, the other output port of said second pair of output ports providing the feedback loop to the input port of the current gain means.

11. The preamplifier circuit according to claim 10 wherein the third transistor circuit comprises a first pair of transistors having their bases commonly connected and their collectors commonly connected, the fourth transistor circuit comprises a second pair of complementary transistors having their emitters connected to the emitter of one transistor of the first pair of transistors and the fifth transistor circuit comprises a further complementary transistor the emitter of the other transistor of the first pair of transistors being connected to the emitters of the further complementary transistor, the collector of the further complementary transistor and of one of the transistors of the second pair being connected to provide the output of the preamplifier circuit and the collector of the other of the transistors of the second pair providing the other output for the feedback loop.

* * * * *

UNITED STATES PATENT AND TRADEMARK OFFICE
CERTIFICATE OF CORRECTION

PATENT NO. : 4,504,797

DATED : March 12, 1985

INVENTOR(S) : Fred L. Eatock

It is certified that error appears in the above-identified patent and that said Letters Patent is hereby corrected as shown below:

Column 6, line 55, "reducing the term $(4qIC/B)^{1/2}$" should read -- reducing the term $(4qICl/B)^{1/2}$ --

Signed and Sealed this

Ninth Day of July 1985

[SEAL]

*Attest:*

DONALD J. QUIGG

*Attesting Officer*   *Acting Commissioner of Patents and Trademarks*